United States Patent [19]

Matsumoto et al.

[11] Patent Number: 4,940,496
[45] Date of Patent: Jul. 10, 1990

[54] SOLAR BATTERY DEVICE

[75] Inventors: Hideo Matsumoto; Katsumi Sato; Shigeru Hokuyo, all of Itami, Japan

[73] Assignee: Mitsubishi Denki Kabushiki Kaisha, Tokyo, Japan

[21] Appl. No.: 296,698

[22] Filed: Jan. 13, 1989

[30] Foreign Application Priority Data

Feb. 3, 1988 [JP] Japan ................................. 63-024292

[51] Int. Cl.$^5$ ............................................. H01L 31/05
[52] U.S. Cl. ....................................... 136/256; 136/244
[58] Field of Search ................................. 136/244, 256

[56] References Cited

FOREIGN PATENT DOCUMENTS 2350696 12/1977 France ................................. 136/244
62-16579 1/1987 Japan .................................... 136/244

OTHER PUBLICATIONS

E. J. Stofel et al., *Conference Record, 17th IEEE Photovoltaic Specialists Conference* (1984), pp. 173–178.

"Solar Cell Design Handbook", vol. 1, pp. 5.2-1-5.2-7, JPL & NASA.

Proc. European Symp. on Photovoltaic Generators in Space, Sep. 1978, pp. 33–40, J. Koch.

*Primary Examiner*—Aaron Weisstuch
*Attorney, Agent, or Firm*—Oblon, Spivak, McClelland, Maier & Neustadt

[57] ABSTRACT

According to the present invention, an electrode is formed on a first region of a light receiving surface of a solar battery element and an end portion of an interconnector is connected to a part of the surface region of the electrode, while an adhesive layer is provided on the light receiving surface, the surface of the electrode and the end portion of the interconnector. Further, one or more through holes are provided in a region of the interconnector being adjacent to the end portion. Thus, even if an adhesive agent forming the adhesive layer flows out during formation of the adhesive layer, the outflow parts of the adhesive agent are trapped in the through holes, whereby the solar battery device can be reduced in size.

2 Claims, 3 Drawing Sheets

SOLAR BATTERY DEVICE

BACKGROUND OF THE INVENTION

1. Field of the Invention

The present invention relates to a solar battery device, and more particularly, it relates to a solar battery device which comprises a plurality of solar battery elements connected in series or parallel with each other by an interconnector.

2. Description of the Background Art

FIG. 1 is a perspective view showing a conventional solar battery device which comprises a solar battery element and an interconnector connected to the same. A first electrode 2 is provided on a portion of a light receiving surface 1a of a solar battery cell 1, while a second electrode 3 is provided on another surface 1b of the solar battery cell 1. When light enters the solar battery cell 1 through the light receiving surface 1a, electromotive force is generated in the solar battery cell 1 to be outputted to the exterior through the first and second electrodes 2 and 3.

In accordance with the mode of application, a plurality of solar battery elements are connected with each other by an interconnector 4. When the voltage outputted by a single solar battery element is lower than a desired level, for example, an appropriate number of such solar battery elements are connected in series with each other by the interconnector 4, to thereby provide a desired voltage.

In order to protect the solar battery cell 1 against radiation or the like, an adhesive layer 5 of an adhesive agent such as silicon resin is provided on the light receiving surface 1a of the solar battery cell 1, the surface of the first electrode 2 and a surface region R of the interconnector 4 corresponding to the first electrode 2, while a transparent glass cover 6 is disposed on the adhesive layer 5.

The glass cover 6 is mounted according to the following sequence:

(1) The adhesive layer 5 in an unhardened state is formed on the light receiving surface 1a of the solar battery cell 1, the surface of the first electrode 2, and the region R of the interconnector 4.

(2) The glass cover 6 is disposed on the adhesive layer 5 in the unhardened state.

(3) Air bubbles contained in the adhesive layer 5 are removed.

(4) Appropriate heat treatment is performed on the adhesive layer 5 in the unhardened state, to harden the same.

FIG. 2 is a sectional view showing the region around the interconnector 4, after mounting of the glass cover 6. In the aforementioned steps (1) to (3), the adhesive layer 5, being in an unhardened state, flows out along the interconnector 4, in tne direction A, as shown in FIG. 2. Then, in the aforementioned step (4), the adhesive layer 5 is hardened. Such a situation may lead to the following problems:

First, the solar battery device may be broken by stress applied from the exterior thereof. In general, the interconnector 4 is provided with a stress relief portion 4a in a position close to the region R, as shown in FIG. 1. This stress relief portion 4a is adapted to relax the stress applied from the exterior to the solar battery device. When tensile stress is applied from the exterior of the solar battery device in a direction B, for example, the stress relief portion 4a is extended in the direction B to absorb energy of the tensile stress, to thereby prevent the solar battery device from breakage. However, if the adhesive agent forming the adhesive layer 5 partially flows in the direction A along the interconnector 4 to infiltrate into the stress relief portion 4a, the stress relief portion 4a is restrained by the adhesive layer 5, and thus the stress relaxing function of the stress relief portion is weakened. Thus, the solar battery device may be broken by the stress applied from the exterior thereof, since the same is directly exposed to such stress.

Further, the conventional solar battery device is increased in size. As shown in FIG. 2, the interconnector 4 is bent in a prescribed position in order to provide interconnection between solar battery elements. The interconnector 4 can be bent at a position $P_1$ in a normal state with no outflow of the adhesive agent. If the adhesive agent flows out, however, the interconnector 4 must inevitably be bent in a position $P_2$. Thus, the length of the interconnector 4 must be increased by a distance x. In other words, the size of the solar battery device is increased by the distance x. Consequently. the solar battery device thus assembled is increased in size, to cause a serious problem particularly in application to an artificial satellite or the like.

In order to solve such problems, the outflow of the adhesive agent may be removed. In case of such removal, however. the interconnector 4 may be damaged, thereby reducing reliability of the solar battery device. Thus, removal of the outflow of the adhesive agent is not preferable from this point of view.

SUMMARY OF THE INVENTION

A solar battery device according to a first embodiment comprises a solar battery element which has a light receiving surface for receiving light and which is provided with an electrode in a region thereof of the light receiving surface, an interconnector having an end portion connected to a surface of the electrode, an adhesive layer provided on the light receiving surface, the surface of the electrode, and the end portion of the interconnector, a transparent cover disposed on the adhesive layer and joined with the light receiving surface, the surface of the electrode, and the end portion of the interconnector by means of the adhesive layer, and at least one through hole provided in a region of the interconnector adjacent to the end portion for limiting outflow of the adhesive layer.

A solar battery device according to a second embodiment comprises a solar battery element which has a light receiving surface for receiving light and which is provided with an electrode in a region thereof of the light receiving surface, an interconnector having an end portion connected to a surface of the electrode and a stress relief portion close to the end portion connected to the electrode, an adhesive layer provided on the light receiving surface, the surface of the electrode, and the end portion of the interconnector, a transparent cover disposed on the adhesive layer and joined with the light receiving surface, the surface of the electrode, and the end portion of the interconnector by means of the adhesive layer, and at least one through hole provided in a region of the interconnector intermediate the end portion and the stress relief portion for limiting outflow of the adhesive layer.

Accordingly, a principal object of the present invention is to reduce the size of a solar battery device.

Another object of the present invention is to provide a small-sized solar battery device which can prevent breakage of a solar battery element and an interconnector.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 3:
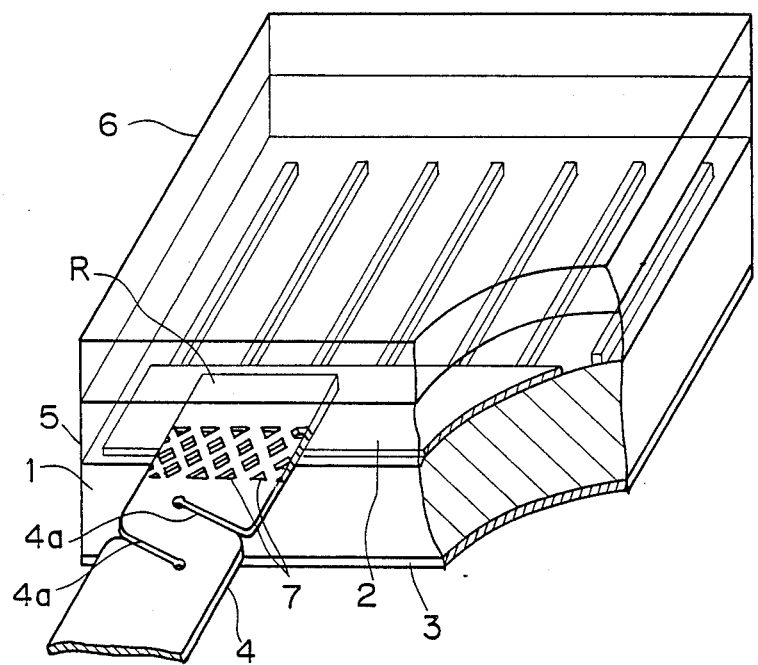
FIG. 3 is a perspective view showing a solar battery device according to an embodiment of the present invention.

FIG. 3 is a perspective view showing a solar battery device according to an embodiment of the present invention.

Figure 1:
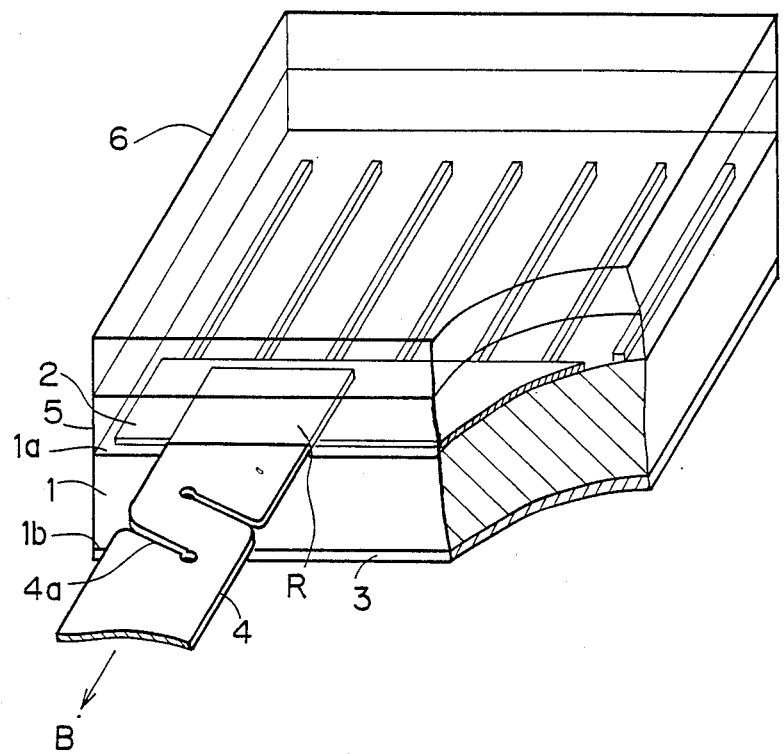
FIG. 1 is a perspective view showing a conventional solar battery device comprising a solar battery element and an interconnector connected to the same.
Figure 2:
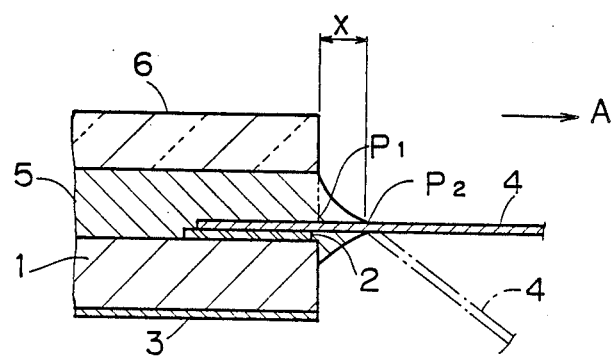
FIG. 2 is a sectional view showing the region around an interconnector after mounting of a glass cover.

The novel feature of the solar battery device shown in FIG. 3 resides in that a large number of through holes 7 are provided in the form of a mesh, for example, in a region of an interconnector 4 between a region R and a stress relief portion 4a. Other structure of this embodiment is identical to that of the conventional solar battery device which is shown in FIG. 1. Thus, redundant description is omitted.

The sequence of mounting a glass cover 6 is also identical to that in the conventional device. Thus, redundant description is also omitted.

Figure 4:
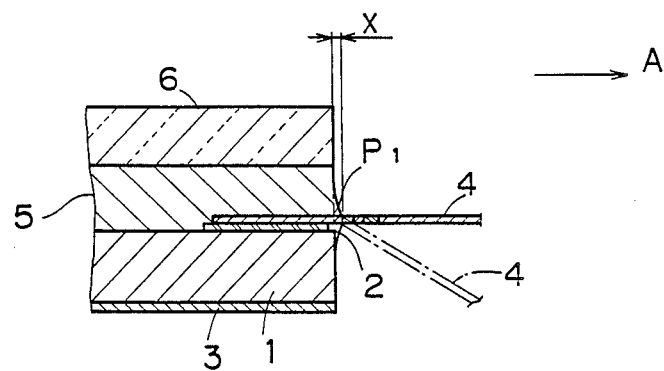
FIG. 4 is a sectional view showing the region around through holes provided in the interconnector, after mounting of the glass cover.
Figure 5:
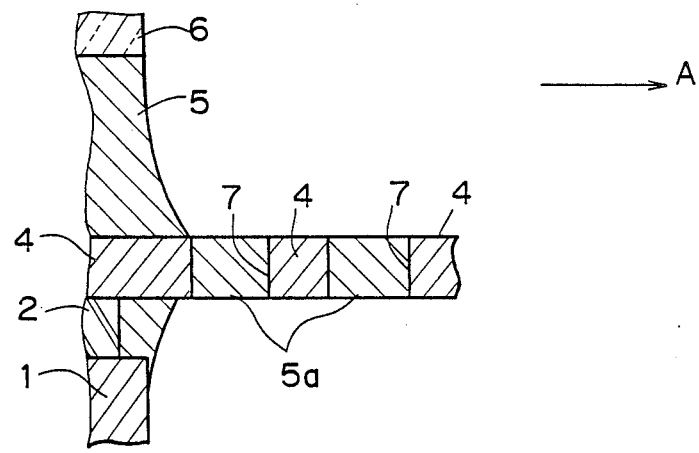
FIG. 5 is a partially enlarged view of FIG. 4.

FIG. 4 is a sectional view showing the region around the through holes 7 provided in the interconnector 4, after mounting of the glass cover 6, and FIG. 5 is a partially enlarged view of FIG. 4. As shown in FIG. 5, parts 5a of the adhesive agent, which forms an adhesive layer 5, flowing out along the interconnector 4 in a direction A in steps (1) to (3) are trapped in the through holes 7. Thus, the adhesive agent, forming the adhesive layer 5, is prevented from outflowing toward the stress relief part 4a, thereby ensuring the function of stress relaxation. Consequently, the solar battery device can be prevented from breaking.

Further, since the outflow parts 5a of the adhesive agent are trapped by the through holes 7, the interconnector 4 can be bent at a position being adjacent to the region R, e.g. at position $P_l$ shown in FIG. 4 or around the same, whereby the distance x is reduced to zero or minimized. Thus, the solar battery device can be reduced in size.

According to the present invention, as hereinabove described, the mechanism for trapping the outflow parts of the adhesive agent forming the adhesive layer 5 is provided in the region of the interconnector 4 held between the region R and the stress relief portion 4a, to thereby prevent the adhesive agent from outflowing toward the stress relief portion 4a and to thereby enable bending of the interconnector at a position adjacent to the region R. Thus, the solar battery device can be reduced in size, while the solar battery element and the interconnector 4 are prevented from breaking.

Although the interconnector 4 is provided with the stress relief portion 4a in the aforementioned embodiment, the present invention is also applicable to an interconnector which is not provided with such stress relief portion. In this case, a large number of through holes 7 are formed in a region of the interconnector 4 adjacent to the region R to trap the outflow parts 5a of the adhesive agent in the through hole 7 and bend the interconnector 4 in a position adjacent to the region R, to thereby reduce the size of the solar battery device.

The through holes 7 are not particularly restricted in configuration. Further, although a plurality of through holes 7 are provided in the aforementioned embodiment, the number of such through holes 7 is not restricted but an effect similar to the above can be attained with a single through hole, for example. The point is that the configuration, the number, and the size of such through hole(s) 7 can be determined in response to the state of application of the solar battery device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar battery device comprising:
    a solar battery element having a light receiving surface for receiving light and provided with an electrode on a region thereof;
    an interconnector having an end portion connected to a surface of said electrode and a stress relief portion close to said end portion;
    an adhesive layer provided on said light receiving surface, the surface of said electrode, and said end portion of said interconnector;
    a transparent cover disposed on said adhesive layer and joined with said light receiving surface, the surface of said electrode, and said end portion of said interconnector by means of said adhesive layer; and
    at least one through hole provided in a region of said interconnector intermediate said end portion and said stress relief portion for limiting outflow of said adhesive layer;
    the minimum distance between an edge of said solar battery element and said stress relief portion being greater than the maximum distance between any of said at least one through hole and said edge of said solar battery element.

2. A solar battery device in accordance with claim 1, wherein
    said at least one through hole is provided in the form of a mesh.

* * * * *